United States Patent
Hishiro

(10) Patent No.: US 7,846,623 B2
(45) Date of Patent: Dec. 7, 2010

(54) RESIST PATTERN AND REFLOW TECHNOLOGY

(75) Inventor: Yoshiki Hishiro, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 239 days.

(21) Appl. No.: 12/081,098

(22) Filed: Apr. 10, 2008

(65) Prior Publication Data

US 2008/0261125 A1    Oct. 23, 2008

Related U.S. Application Data

(62) Division of application No. 10/840,647, filed on May 7, 2004, now Pat. No. 7,371,509.

(51) Int. Cl.
*B32B 5/14* (2006.01)

(52) U.S. Cl. ........................................................ 430/9

(58) Field of Classification Search ................. 430/322, 430/311, 9, 330
See application file for complete search history.

(56) References Cited

U.S. PATENT DOCUMENTS

| 4,022,932 | A | 5/1977 | Feng | |
|---|---|---|---|---|
| 5,552,342 | A | 9/1996 | Itou et al. | |
| 5,960,315 | A | 9/1999 | Gambino et al. | |
| 6,368,974 | B1 * | 4/2002 | Tsai et al. | 438/695 |
| 6,486,058 | B1 * | 11/2002 | Chun | 438/637 |
| 2002/0076656 | A1 * | 6/2002 | Huang et al. | 430/322 |

* cited by examiner

*Primary Examiner*—Kathleen Duda
*Assistant Examiner*—Brittany Raymond
(74) *Attorney, Agent, or Firm*—Dickstein Shapiro LLP

(57) ABSTRACT

A reflow stabilizing solution for treating photoresist patterns and a reflow technology are disclosed. The reflow stabilizing solution comprises a polymer and is applied after the photoresist material has been developed and patterned. By treating the photoresist with the reflow stabilizing solution after resist patterning and further subjecting the reflow stabilizing solution to a heat treatment, the non-volatile polymer remains in between adjacent resist patterns and acts as a stopper to the reflowed photoresist. In this manner, the non-volatile polymer provides structural and mechanical support for the reflowed resist, preventing resist collapse at high temperatures and allowing the formation of reflowed resist structures having line width dimensions in the submicron range.

14 Claims, 5 Drawing Sheets

RESIST PATTERN AND REFLOW TECHNOLOGY

CROSS REFERENCE TO RELATED APPLICATIONS

The present application is a divisional of U.S. application Ser. No. 10/840,647, filed on May 7, 2004 now U.S. Pat. No. 7,371,509, the disclosure of which is herewith incorporated by reference in its entirety.

FIELD OF THE INVENTION

The invention relates to the fabrication of electronic components such as integrated circuit semiconductors and, in particular, to a method of forming resist patterns using a resist reflow technique.

BACKGROUND OF THE INVENTION

Photolithographic patterning is a well-established technology in the manufacturing processes of various kinds of semiconductor devices and liquid crystal display panels. According to photolithographic patterning, a photosensitive resist composition is first coated onto a surface of a substrate to form a photoresist layer. The photoresist layer is then exposed to radiation, such as ultraviolet light or electron beam, so that some portions of the photoresist are impacted by radiation while other portions of the photoresist are not impacted by the radiation. Subsequently, the photoresist is subjected to a developer solution, which selectively removes either the impacted or non-impacted portions of the photoresist. If the photoresist is a positive photoresist, the impacted portions are selectively removed; if the photoresist is a negative photoresist, the non-impacted portions are selectively removed. The photoresist material remaining after development shields or masks the regions of the substrate from subsequent etch or implant operations.

In recent years, the minimum feature size of advanced ULSIs has reached the resolution limits of the conventional optical lithography technology. For example, it is known that i-line lithography technology is adequate for forming a contact hole having a minimum feature size of over 0.30 to 0.35 µm. Thus, with current i-line optical lithography systems, the minimum feature size below sub-0.18 µm would be very difficult to achieve.

Various attempts to solve the resolution problem, particularly the extension of the optical lithography technology for sub-0.18 µm contact hole lithography, have been known in the art. These attempts include (i) phase shift mask (PSM) technology; (ii) off-axis illumination (OAI) technology; (iii) resist reflow technology; and (iv) a multi-layer resist (MLR) processing. Among these technologies, the resist reflow technology is most desirable because of its simplicity.

According to conventional reflow processes, the photoresist layer is typically applied as a thick photoresist layer, with a thickness over 0.5 microns. The thick photoresist layer is patterned and the photoresist layer is subsequently developed and heated to a high temperature (e.g., between 120 to 170° C.). During heating, the photoresist layer becomes almost plasticized (e.g., viscous or semi-liquid) and the photoresist material flows due to the high temperatures associated with the heating step. The heating of the thick photoresist layer reduces the width associated with features in the resist pattern because the edges of the resist pattern flow closer together, therefore making a smaller hole or trench. After the photoresist layer has been heated (i.e., reflowed), conventional semiconductor processes are conducted.

Reflow technologies require thick photoresist layers to ensure that a sufficient amount of material is available to reflow. However, the use of thick photoresist layers has an adverse effect on lithographic resolution. Variations in thickness uniformity can affect the precision associated with focusing the radiation on the photoresist layer (i.e., it is difficult to have a precise depth of focus when the photoresist layer is thick). Other conventional processes have utilized ultrathin photoresist layers. Ultrathin photoresist layers have achieved greater resolution than thick photoresist layers. However, reflow technologies have not been applied to ultrathin photoresist layers because the ultrathin photoresist layer does not provide adequate material for the flow operation (i.e., the ultrathin photoresist layer is too thin to provide sufficient material to flow without compromising other areas of the photoresist layer). Another disadvantage of both the thick and ultrathin photoresist layers is that, although the area of the aperture (hole or trench) can be reduced, the critical dimension (CD) control is very difficult in the reflow technology because severe overhang often results in the photoresist contact hole pattern. In addition, the photoresist contact hole pattern could collapse or close at high temperatures.

Accordingly, there is a need for a reflow stabilizing solution that acts as a stopper control flow and allows precise CD control in reflow techniques for both thick and ultrathin photoresists. Also needed is a controlled resist reflow process for reducing the dimensions of resist apertures, while preventing overhang or collapse of the resist patterns. A method of forming a pattern resist mask for fabricating structures having line width dimensions in the submicron range is also needed.

SUMMARY OF THE INVENTION

In one aspect, the present invention provides, as an exemplary embodiment, a reflow stabilizing solution for treating photoresist patterns to prevent overhang or collapse of the resist patterns during reflow. The reflow stabilizing solution comprises a soluble non-volatile polymer and is applied after the photoresist material has been developed and patterned. By treating the photoresist with the reflow stabilizing solution after resist patterning and further subjecting the reflow stabilizing solution to a heat treatment, the non-volatile polymer remains in between adjacent resist patterns and acts as a stopper to the reflowed photoresist. In this manner, the non-volatile polymer provides structural and mechanical support for the reflowed resist, preventing resist collapse at high temperatures and allowing the formation of reflowed resist structures having line width dimensions in the submicron range.

In another aspect, the present invention provides an exemplary embodiment of a controlled resist reflow method. The method comprises the steps of forming a photoresist layer on a substrate, exposing the photoresist layer through a mask to create an exposed area of photoresist and an unexposed area of photoresist; developing the photoresist layer; applying a reflow stabilizing treatment to the photoresist layer without changing the physical and chemical properties of the photoresist; and subjecting the photoresist layer to a heat treatment.

Additional advantages and features of various embodiments of the present invention will be apparent from the

DETAILED DESCRIPTION OF THE INVENTION

Figure 1:
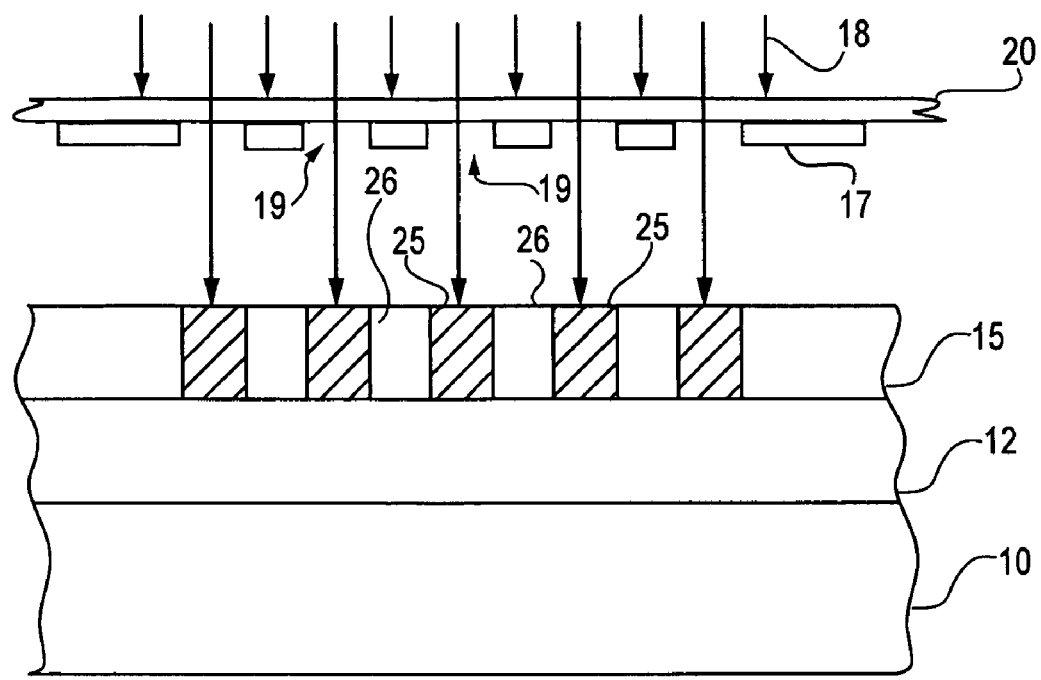
FIG. 1 is a cross-sectional view of a layer of photoresist undergoing a reflow process according to the present invention.

In the following detailed description, reference is made to various specific embodiments in which the invention may be practiced. These embodiments are described with sufficient detail to enable those skilled in the art to practice the invention, and it is to be understood that other embodiments may be employed, and that structural and logical changes may be made without departing from the spirit or scope of the present invention.

The terms "substrate" and "wafer" can be used interchangeably in the following description and may include any semiconductor-based structure or insulating structure on or at the surface if which circuitry may be formed. The structure should be understood to include silicon, silicon-on insulator (SOI), silicon-on-sapphire (SOS), doped and undoped semiconductors, epitaxial layers of silicon supported by a base semiconductor foundation, and other semiconductor and insulating structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

The terms "resist" and "photoresist" can be used interchangeably in the following description. For the purposes of the present invention, the term "reflowed resist" or "reflowed photoresist" is defined as a resist or photoresist material subjected to a temperature of about 90 to about 220° C., more preferably of about 130 to about 200° C.

The inventors of the present invention have realized that pattern density may be increased and resist pattern collapse may be reduced if photoresist patterns are immersed in a reflow stabilizing solution and subjected to a reflow stabilizing treatment during photoresist reflow processing. The reflow stabilizing solution is a polymer solution or suspension. Subsequent to the patterning of the resist, the polymer solution is applied in between adjacent resist patterns by a spin off process, for example, to partially fill the space defined by adjacent resist patterns. Subsequently, the wafer is subjected to a high temperature bake so that solvent (such as water, for example) from the polymer solution evaporates, leaving polymer material to fill in partially the space between adjacent resist patterns and to act as a stopper to the reflowed photoresist. In this manner, at high temperature bake, the resist becomes slightly fluid and bulges adjacent to the stopper polymer material, defining therefore small patterns by a minimal distance or critical dimension CD preferably less than or equal to 0.20 µm.

Referring now to the drawings, where like elements are designated by like reference numerals, FIGS. 1-10 illustrate methods of forming photoresist step patterns using a positive photoresist according to embodiments of the present invention. For exemplary purposes only, the embodiments below will be described with reference to a positive photoresist; however, the invention also contemplates methods of forming photoresist step patterns using a negative photoresist.

For a better understanding of the present invention, a brief description of the principal characteristics of positive and negative resists will be provided below and before detailing the specific embodiments of the present invention. As known in the art, positive resists are sensitized when exposed to ultraviolet light so that exposed areas will dissolve in a developer solution leaving behind unexposed areas. In contrast, negative resists are hardened by exposure to ultraviolet light so that exposed areas are inhibited from being dissolved by the developer solution while unexposed areas are dissolved.

Positive photoresists are typically three-component materials, consisting of a matrix material, a photo-sensitive component and a solvent. Generally, the matrix components of positive photoresists are low-molecular weight phenolic polymers, acrylic polymers or other addition polymers, that provide the mechanical properties of the photoresist layer. The matrix polymers contain some level of pendant acidic site precursors such as alkyl esters. The photoresist formulation also contains a photosensitive component which, upon exposure to actinic light, for example, generates an acid. This acid catalytically cleaves the ester linkage causing the polymer to become soluble in the aqueous alkaline developer. The solvent component suspends the matrix polymer and photosensitive compound in a flowable liquid until the photoresist layer is cured with a soft-bake prior to being exposed to actinic light. Typical positive photoresist solvents include ketones, esters and alcohols, e.g., heptanone, propylene glycol methyl ether acetate, ethyl lactate, propylene glycol methyl ether.

Negative photoresists are also three-component materials, consisting of a matrix component, a sensitizer component and a solvent. Typically, negative photoresists comprise the same or similar polymers and photosensitive compounds as the positive photoresists, except that they contain cross-linkable groups rather than cleavable acid protecting groups. Negative photoresist solvents are generally similar to those used for positive photoresists.

Referring to FIG. 1, a positive photoresist layer 15 is formed by deposition or spin coating, for example, on a layer 12 which in turn is formed over a substrate 10. The layer 12 containing the pattern lines to be formed may comprise any layer of material used in an electronic or semiconductor device, such as an insulating, metal or semiconductor layer. Layer 12 may comprise an insulating layer in a semiconductor device, such as a first level insulating layer or an intermetal dielectric. Layer 12 may also comprise an antireflective coating (ARC), such as a BARC layer or a DARC layer, for example, as well-known in the art.

After the photoresist layer 15 has been formed on layer 12 over substrate 10, the photoresist layer 15 is preferably soft-baked to remove any existing solvents. For example, the soft-baking may be conducted at a temperature of about 90° C. to 150° C. for about 30 to 120 seconds on a hot plate. However, any suitable time and temperature and baking equipment may be used depending on the photoresist material.

The photoresist layer 15 is subsequently exposed to radiation 18, such as actinic light or other suitable UV radiation, through openings 19 in the opaque pattern 17 in a mask or reticle 20 to form exposed regions 25 in the photoresist layer 15, as illustrated in FIG. 1. During this step, the exposed regions 25 of the positive photoresist layer 15 are rendered soluble to developer solution. In contrast, remaining regions 26 of the photoresist layer 15 are shielded by the opaque layer 17 of the mask 20 and are not exposed. Thus, the exposed photoresist regions 25 are separated by unexposed regions 26, which remain insoluble to the developer.

Figure 2:
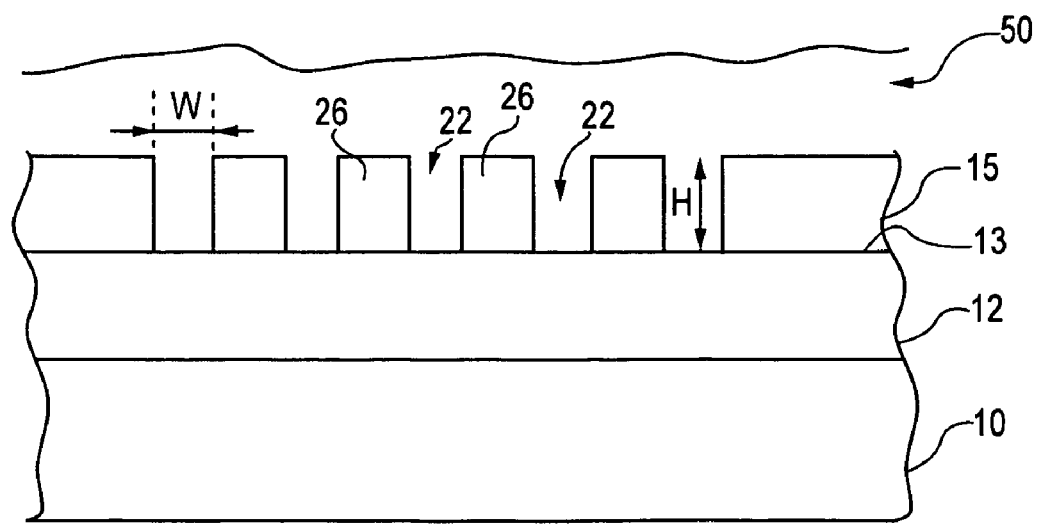
FIG. 2 shows the layer of photoresist of FIG. 1 at a stage of processing subsequent to that shown in FIG. 1.

After the exposing step, the photoresist layer 15 is developed to remove the exposed photoresist regions 25 from the unexposed regions 26 and to provide openings 22 within the photoresist layer 15, as shown in FIG. 2. Photoresist regions 26 are not removed during development and are used in the reflow method of the present invention and subsequent steps and processes, such as etching or implanting of the underlying layer 12. The photoresist layer 15 may be developed by any of the methods known in the art, including but not limited to quiescence, immersion, spray and puddle development. A brief description of these development methods is provided below.

The quiescense method adds developer to the exposed wafer surface and, after a period of time sufficient to develop the pattern, a rinse composition is added to the wafer surface and the wafer is then dried.

The immersion process comprises dipping the exposed semiconductor wafer into a bath of the developer composition for a predetermined period of time, and then removing the wafer from the bath. After the wafer has been removed from the immersion bath, it is immersed in a rinse bath. A displacement rinse method may be used using the same tank for both the development immersion and rinsing. Instead of immersing the developed wafer, the immersed wafer could be rinsed by spraying.

In the spray development method, the exposed wafer is sprayed with the developing composition for a certain period of time to develop the pattern typically for about 1 to 2 minutes. The developed wafer is then sprayed with the rinse composition to rinse the developer from the wafer surface. The rinse composition is typically sprayed for about 1 to 2 minutes and then dried using conventional techniques such as air drying.

In the puddle development process, which is the preferred development method in the present invention, the developing composition is puddled onto the exposed semiconductor wafer while the wafer is at rest and then the wafer is spun slowly at, for example, 100 rpm to distribute the developing composition over the wafer surface. The developer is then left on the wafer surface for sufficient time to develop the pattern, for example about 1 to 2 minutes. The rinse composition is then puddled onto the still wet wafer surface typically while the wafer is at rest and spun similarly to the developing composition to rinse the wafer.

The developing composition which may be used in the methods of the present invention may be any suitable commercial developer. Developing compositions are typically basic and may contain potassium hydroxide, sodium hydroxide, sodium silicate and the like as the principal component, but it is preferred that the basic component be a basic organic compound which is free from metal ions such as tetramethyl ammonium hydroxide.

In the developing step, which can employ any of the development methods described above, the exposed areas 25 of positive photoresist layer 15 are removed by a developing solution to leave photoresist regions 26 with the desired pattern image on surface 13 of the layer 12. As illustrated in FIG. 2, the photoresist regions 26 have a height H (which represents the thickness of the photoresist layer 15) of about 1,000 to about 50,000 Angstroms and are spaced apart from each other by a predetermined distance W.

At the end of the developing step, the surface 13 is rinsed to stop the developing reaction and remove the developer solution from the surface. As noted above, typical positive resist developer solutions are alkaline solutions diluted with water, which require only a water rinse. Negative resist developer solutions may be organic solvents, which require rinsing with other organic solvents (e.g. n-butyl acetate) or alkaline solutions. Thus, for the positive photoresist layer 15 described above, a rinse solution such as an aqueous rinse, for example de-ionized (DI) water rinse, is conducted to stop the developing reaction and remove the developer solution from the surface 13 of the layer 12. The rinse solution rapidly dilutes the developer chemical so that the developing action stops. The rinse also removes any partially polymerized pieces of resist from the open regions in the resist film.

Figure 3:
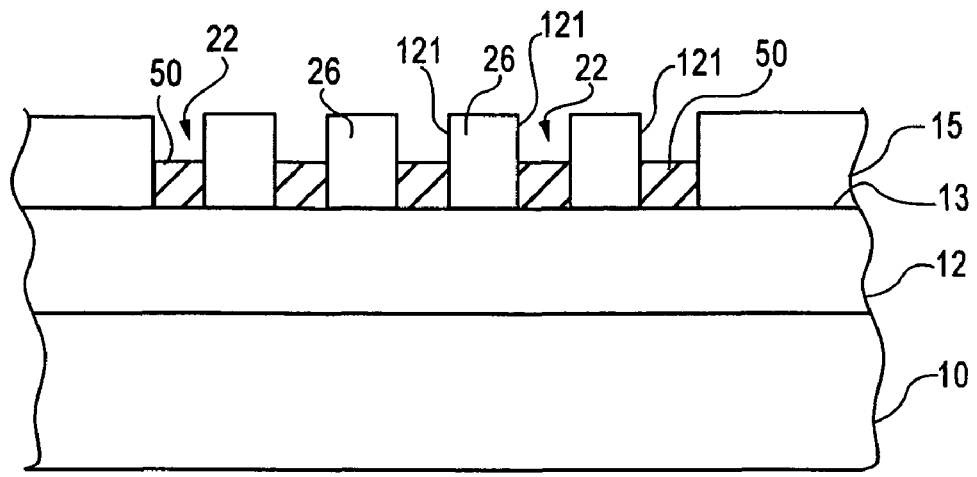
FIG. 3 shows the layer of photoresist of FIG. 1 at a stage of processing subsequent to that shown in FIG. 2.

As illustrated in FIG. 2, subsequent to the development and rinse of the photoresist layer 15 and before or after drying, the rinse solution is displaced by a reflow stabilizing polymer solution or suspension 50 containing at least one non-volatile polymer component, and the substrate is subjected to a reflow stabilizing treatment according to a method of the present invention. Polymer solution 50 containing at least one non-volatile polymer component is applied to the remaining positive photoresist layer 15 (i.e., the unexposed photoresist regions 26) by displacing at least part of the rinse solution and filling partially the space between photoresist regions 26. For exemplary purposes only and for simplicity, the polymer solution 50 is illustrated in FIG. 3 as filling about half the space of the opening 22 and extending about half the height H of the photoresist regions 26. Thus, although the embodiments below will be described with reference to the polymer solution 50 extending about half the height H of the photoresist regions 26, it must be understood that the invention also contemplates the polymer solution 50 extending more or less than about half the height H, as desired. However, to allow step pattern formation, the polymer solution 50 must not completely fill the space between adjacent photoresist regions 26 and must not extend the whole height H of the photoresist regions 26.

The polymer solution 50 of the present invention may comprise a solvent (such as water, for example) and any non-volatile polymer component that can be dry etched highly selectable to the photoresist material 15. In addition, the non-volatile polymer component needs to be soluble in a suitable solvent to form the polymer solution 50. For example, in one embodiment of the present invention, the polymer solution 50 is an aqueous polymer solution which may comprise PVA (polyvinyl alcohol), PVP (polyvinyl pyrrolidone) or any polymer, such as for example, an acrylic polymer, which is soluble in water. The polymer may further comprise chemical cross-links throughout the polymer. Exemplary polymers include homopolymers and copolymers comprising polyhydroxyethylmethacrylate, polymethylmethacrylate, substituted polymethylmethacrylate, and polystyrene, among others. The polymer may also comprise an acidic unit (if the resist needs to be smoothed effectively) or, alternatively, an acidic additive may be subsequently added to the aqueous polymer solution 50.

In another embodiment of the present invention, the polymer solution 50 may comprise PVA (polyvinyl alcohol) or any polymer such as the ones described above and further in combination with a polymeric precursor (which may include cross-linking materials) suspended or dissolved in a suitable solvent (and further optionally comprising water). Solvents can include, for example, ethyl lactate, methylamylketone, polypropyleneglycol monomethyletheracetate (PGMEA), and propyleneglycol monomethylether (PGME). These solvents may be used with polymeric precursors which may comprise benzoyl peroxide, benzil and/or benzil derivatives, together with cross-linking materials selected from the group consisting of hexamethoxymethirol melamine and tetramethoxyglycouril.

The polymer solution 50 containing a non-volatile polymer component may be added to gradually replace the rinse solution (before drying) or may be directly contacted with the photoresist layer 15 after rinse (after drying). However, it must be understood that the invention also contemplates embodiments wherein the polymer solution 50 containing a non-volatile polymer component is applied to the substrate 10 by immersing the substrate in a separate bath containing the polymer solution 50 containing a non-volatile polymer component. In addition, the polymer solution 50 containing a non-volatile polymer component may be applied only to one area of interest of the photoresist layer 15, whereas the other remaining photoresist areas may be subjected to a drying process, for example. In this case, only the area of interest of the photoresist layer 15 may be immersed or submerged in the polymer solution 50 containing a non-volatile polymer component, while the rest of the substrate may be allowed to dry.

Reference is now made to FIG. 3. In accordance with an exemplary embodiment of the present invention, subsequent to the displacement of the rinse solution with the polymer solution 50 containing at least one non-volatile polymer component of the present invention, substrate 10 is subjected to a heat treatment, for example a bake at about 90° C. to about 220° C., preferably of about 130° C. to about 200° C., so that water or the solvent of the polymer solution 50 containing at least one non-volatile polymer component evaporates, leaving non-volatile polymer component 55. As a result of water or solvent evaporation from the polymer solution 50, the non-volatile polymer component 55 shrinks to a critical dimension CD smaller than the width W.

Figure 4:
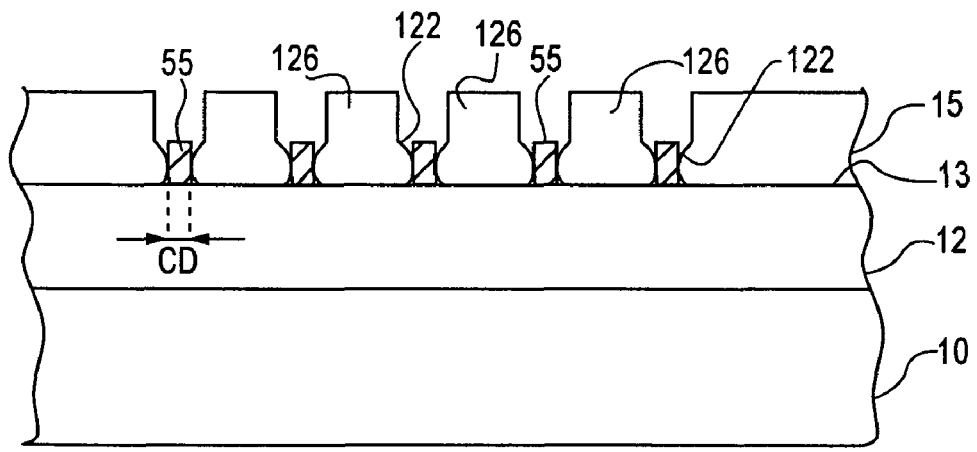
FIG. 4 shows the layer of photoresist of FIG. 1 at a stage of processing subsequent to that shown in FIG. 3.

During the heat step and the water or solvent evaporation from the polymer solution 50 described above, the resist material of the photoresist regions 26 becomes almost viscous or semi-liquid and flows due to the high temperatures associated with the heating step. The flow of the resist material causes edges 121 (FIG. 3) of the resist pattern 26 adjacent the shrinking polymer 55 to flow closer together and to bulge at the bottom half of the photoresist regions 26, forming therefore step photoresist regions 126 having reflowed photoresist regions 122 adjacent the polymer component 55, as shown in FIG. 4. The reflowed photoresist regions 122 extend outwardly from the region 126. The formation of reflowed photoresist regions 122 reduces the width W of openings 22 and (upon removal of polymer component 55) defines hole or trench 130 (FIG. 5) having a minimal width or critical dimension CD smaller than the width W. The degree in the reduction of the width W to achieve the critical dimension CD depends on a variety of factors such as the temperature and conditions of the baking and reflowing steps, the nature of the material of the reflowed photoresist regions 122, the nature of the subsequent process that employs the critical dimension patterns, for example etching or implantation, among others. For exemplary purposes only, the minimal width or critical dimension CD of the hole or trench 130 (FIG. 5) may be less than about 1 µm, more preferably less than about 0.3 µm, and most preferably less than about 0.2 µm. The non-volatile polymer component 55 acts as a stopper reflow during the baking and reflowing of the resist material of the photoresist regions 126.

Although the non-volatile polymer component 55 is illustrated in FIG. 4 as only partially filling in the space between adjacent photoresist regions 126 and extending about half the height of the photoresist regions 126, the invention also contemplates the embodiments wherein the non-volatile polymer component 55 fills less or more than half of the space between adjacent photoresist regions 126, extending therefore less or more than about half the height of the photoresist regions 26. The non-volatile polymer component 55 remaining between adjacent photoresist regions 126 acts as a stopper reflow and provides structural support for the photoresist regions 126 during reflow, to prevent collapse of these regions at the end of the reflow process.

Figure 5:
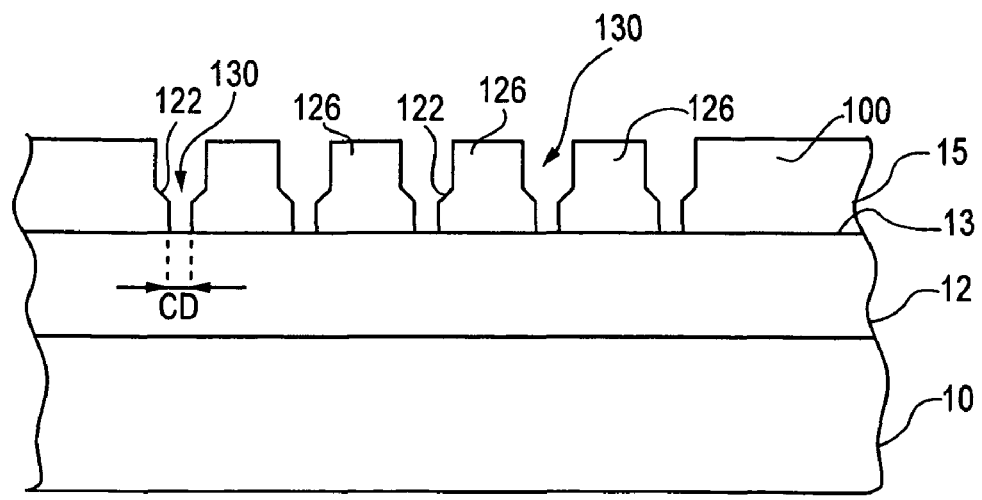
FIG. 5 shows the layer of photoresist of FIG. 1 at a stage of processing subsequent to that shown in FIG. 4.

The structure of FIG. 4 is then subjected to an etching process to remove the non-volatile component 55 from the substrate and to form reflowed photoresist regions 126 defining hole or trench 130 (FIG. 5) having a minimal width or critical dimension CD. The etching process may be a dry etching, such as a plasma etching (for example an $O_2$ plasma etching), or a wet etching employing a liquid etching medium, which removes the non-volatile component 55, as illustrated in FIG. 5. The reflowed photoresist regions 126 form a step reflowed pattern mask 100 (FIG. 5) which may be employed for subsequent semiconductor processes, such as etching or implanting, among others, and as described in more detail below.

Subsequent to the removal of the non-volatile component 55, the structure of FIG. 5 is dried and optionally treated with ultraviolet radiation to reduce the tendency of the photoresist to additionally flow during subsequent processing steps where the photoresist may further experience high temperatures, which may include plasma etching, ion implantation and ion milling, for example. This treatment is typically accomplished by irradiating the dried photoresist with deep UV while heating the substrate to a high temperature (e.g., 120-190° C.) for approximately a minute. Alternatively, the developed, rinsed, treated and dried photoresist layer may be further treated by irradiating the surface with electron beams with energies of about 1 to 100 KeV.

The embodiment of the present invention described above is further explained with reference to the following example and in conjunction with FIG. 6. The invention is not intended to be limited to the particular example described below:

EXAMPLE 1

A bare silicon wafer was processed with 4 µm Shipley UV26 resist on a silicon wafer and exposed at standard exposure/focus. The wafer received a standard post-exposure bake. The wafer was subsequently developed and rinsed in a dump rinse tank, and then pulled out from the tank and placed horizontally with the resulting resist patterns remaining on the silicon wafer. An aqueous PVA solution was then applied to the wafer before the drying process to fill up about ⅓ of the height of the space between adjacent resist patterns. The wafer was subsequently subjected to a heat treatment of about 190° C. during a reflow treatment, to allow the water to evaporate from the PVA solution and to leave the PVA polymer in between the resist patterns. During the high heat treatment, the ⅓ lower portion of the resist patterns adjacent the PVA polymer bulged toward the PVA polymer to create reflowed step resist patterns.

Figure 6:
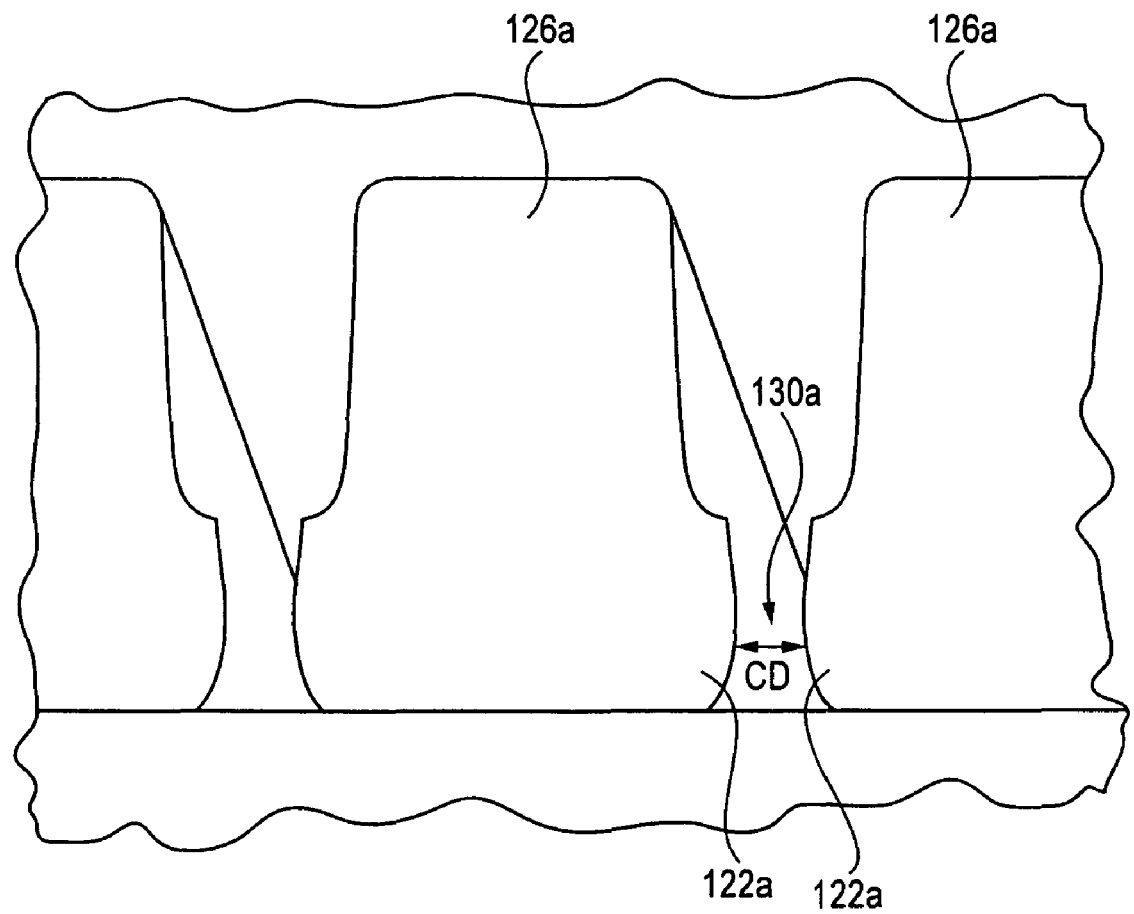
FIG. 6 shows a microphotograph of a layer of photoresist undergoing a reflow process according to the present invention.

FIG. 6 is a photograph illustrating step resist lines 126a after reflow and subsequent to the removal of the PVA polymer, fabricated as detailed in Example 1. As shown in FIG. 6, the step resist lines 126a have a lower reflowed resist portion 122a that bulges outwardly from the upper portion of the resist lines 126a. In this manner, aperture 130a formed within the resist layer by the reflow method described above has a minimal width or critical dimension CD of about 0.2 µm.

Reference is now made to FIGS. 7-10, which illustrate exemplary applications of the method of the present invention, according to which a step resist pattern mask formed by a reflow method of the present invention is employed for an etching process (FIGS. 7 and 8) and for an implantation process (FIGS. 9 and 10), respectively.

Figure 7:
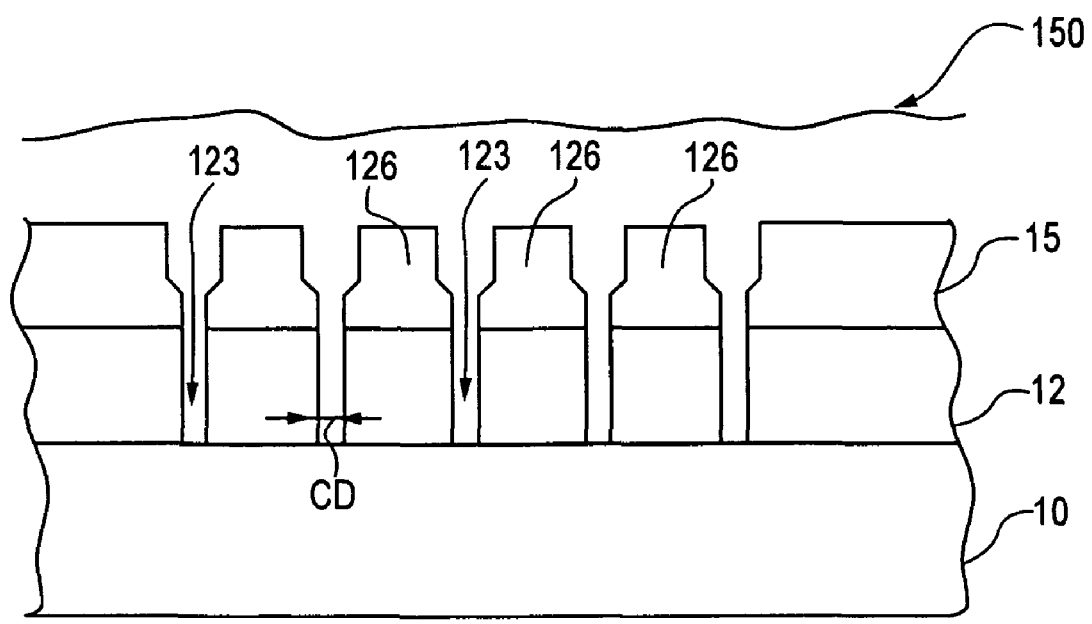
FIG. 7 shows the layer of photoresist of FIG. 5 at a stage of processing subsequent to that shown in FIG. 5 and in accordance with a first embodiment of the present invention.
Figure 8:
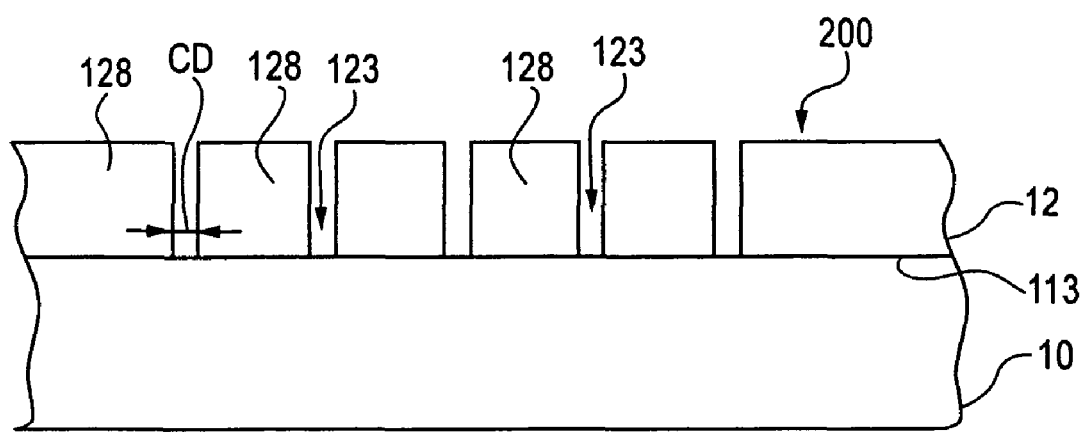
FIG. 8 shows the layer of photoresist of FIG. 5 at a stage of processing subsequent to that shown in FIG. 7.

FIG. 7 illustrates the structure of FIG. 5 at the end of the reflow stage and formed as described in detail above with reference to the method of the present invention but further subjected to an etching process, for example a wet etch employing an etching solution 150. The etching solution 150 etches layer 12 selective to the substrate 10, to form photolithographic pattern 200 comprising desired patterns or lines 128 within layer 12, as shown in FIG. 8. Depending on the nature of the material of layer 12, the etching process may be also a dry etching, such as a plasma etching, for example, which is permitted to remove the material of layer 12 and to reach underlying surface 113 of the substrate 10 through openings 123, as illustrated in FIG. 8. In this manner, patterns or lines 128 are formed within the layer 12 to define openings 123 having a minimal width or critical dimension CD, by employing a step resist pattern mask formed according to the reflow method of the present invention.

Although the embodiment above has been described with reference to the etching solution 150 being applied subsequent to the removal of the polymer component 55 (FIG. 4), it must be understood that the invention is not limited to this embodiment and also contemplates using the etching solution 150 for both the removal of the polymer component 55 and for the etching of layer 12.

Figure 9:
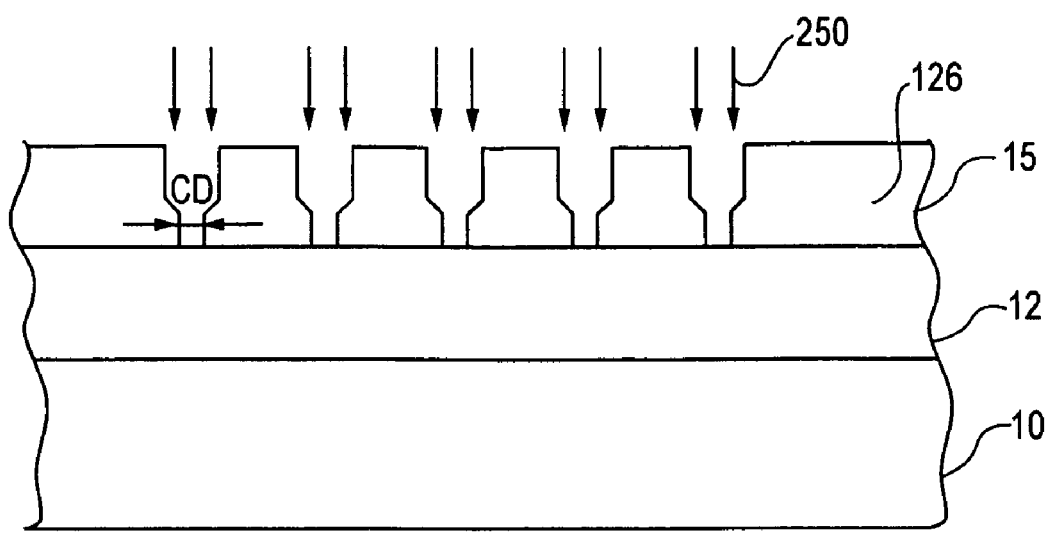
FIG. 9 shows the layer of photoresist of FIG. 5 at a stage of processing subsequent to that shown in FIG. 5 and in accordance with a second embodiment of the present invention.
Figure 10:
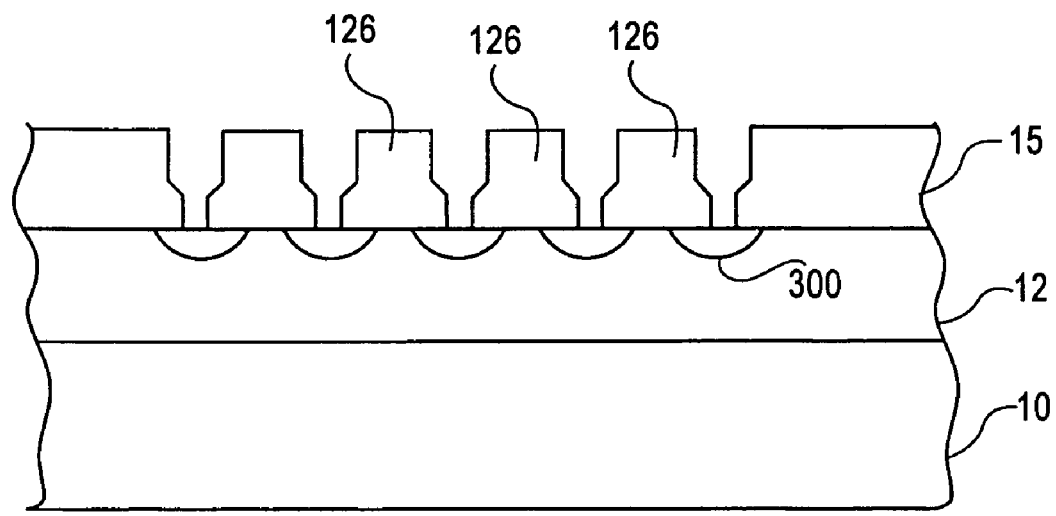
FIG. 10 shows the layer of photoresist of FIG. 5 at a stage of processing subsequent to that shown in FIG. 9.

FIGS. 9 and 10 illustrate the structure of FIG. 5 at the end of the reflow stage and formed as described in detail above with reference to the method of the present invention but further subjected to an implanting process, for example a dopant implantation 250. Step patterns 126 formed by a reflow method according to the present invention act as an implantation mask for the dopants of the dopant implantation 250 to allow formation of implant patterns 300 within layer 12, as shown in FIG. 10. Dopant implantation 250 may be conducted at any implantation angle relative to the substrate 10, depending on the nature of the implant patterns 300.

Although the embodiments above have been illustrated with reference to the formation of a trench in a material layer, such as trench 123 having a particular minimal width or critical dimension CD within layer 12 (for example and as noted above, of less than about 1 µm, more preferably less than about 0.3 µm, and most preferably less than about 0.2 µm), it must be understood that the invention is not limited to the formation of trenches or holes having a particular critical dimension. Accordingly, the invention may be also employed for the formation of any semiconductor pattern that requires patterning and etching, for example, for defining any openings having any critical dimension CD within a semiconductor substrate, including any insulating or conductive layer. Thus, the methods of the present invention may be also employed to form a capacitor contact, for example, having a high aspect ratio, typically higher than 2.0, or a combination of capacitor trenches and contact holes, and further having a predefined critical dimension CD. Referring to FIG. 8, for example, opening 123 may be of any capacitor structure or contact hole opening having a high aspect ratio of about 2.0, preferably higher than 2.0 and most preferably of about 3.0, and further having a critical dimension CD of, for example, less than about 1 µm. However, opening 123 may also have a critical dimension CD which is not limited to the critical dimension CD examples noted above, especially for step patterns requiring openings larger than about 1 µm. Accordingly, the reflow stabilizing methods and compositions of the present invention may be employed for the step patterning used for the formation of any capacitor structures and any contact holes, among others, during IC fabrication.

The above description illustrates preferred embodiments that achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A semiconductor construct comprising:
   a substrate;
   a reflowed photoresist pattern over the substrate, the reflowed photoresist pattern comprising at least two adjacent pattern structures formed over a surface of the substrate; and
   a non-volatile polymer provided between the at least two adjacent pattern structures for affecting the shape of the reflowed photoresist pattern, the non-volatile polymer partially filling the space between the at least two adjacent pattern structures and extending below a top surface of the at least two adjacent pattern structures.

2. The semiconductor construct of claim 1, wherein the polymer is selected from the group consisting of homopolymers and copolymers.

3. The semiconductor construct of claim 1, wherein the reflowed photoresist pattern forms at least part of a mask pattern.

4. The semiconductor construct of claim 3, wherein the mask pattern is employed for the formation of at least part of a capacitor structure.

5. The semiconductor construct of claim 3, wherein the mask pattern is employed for the formation of at least part of a contact hole structure.

6. A reflowed photoresist mask structure, comprising:
   a plurality of reflowed pattern structures provided over a substrate, at least two of the plurality of reflowed pattern structures being spaced apart from each other by less than about 1 µm; and
   a non-volatile polymer partially filling space between the at least two reflowed pattern structures and extending below a top surface of the at least two reflowed pattern structures.

7. The reflowed photoresist mask structure of claim 6, wherein each of the plurality of reflowed pattern structures is spaced apart from each other by less than about 0.3 µm.

8. The reflowed photoresist mask structure of claim 6, wherein each of the plurality of reflowed pattern structures is spaced apart from each other by less than about 0.2 μm.

9. The reflowed photoresist mask structure of claim 6, wherein the at least two of the plurality of reflowed pattern structures are part of an etching mask.

10. The reflowed photoresist mask structure of claim 6, wherein the at least two of the plurality of reflowed pattern structures are part of an implantation mask.

11. A semiconductor construct comprising:
a substrate;
a reflowed photoresist pattern over the substrate, the reflowed photoresist pattern comprising at least two adjacent reflowed photoresist structures, a non-volatile polymer partially filling space between the at least two adjacent reflowed photoresist pattern structures and extending below a top surface of the at least two adjacent reflowed photoresist pattern structures; and
at least two adjacent pattern structures located below the at least two adjacent reflowed photoresist structures, the at least two adjacent pattern structures being spaced apart from each other by less than about 0.3 μm.

12. The semiconductor construct of claim 11, wherein the at least two adjacent pattern structures are spaced apart from each other by less than about 0.2 μm.

13. The semiconductor construct of claim 11, wherein the at least two adjacent pattern structures form at least part of a capacitor structure.

14. The semiconductor construct of claim 11, wherein the at least two adjacent pattern structures form at least part of a contact hole structure.

\* \* \* \* \*